(12) United States Patent
Morita et al.

(10) Patent No.: US 6,755,910 B2
(45) Date of Patent: Jun. 29, 2004

(54) METHOD FOR PULLING SINGLE CRYSTAL

(75) Inventors: Hiroshi Morita, Toyko (JP); Hideki Watanabe, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 5 days.

(21) Appl. No.: 10/230,987

(22) Filed: Aug. 30, 2002

(65) Prior Publication Data

US 2003/0047131 A1 Mar. 13, 2003

(30) Foreign Application Priority Data

Sep. 11, 2001 (JP) ........................................ 2001-275183

(51) Int. Cl.$^7$ ............................................... C30B 15/20
(52) U.S. Cl. ........................ 117/13; 117/208; 117/217; 117/218; 117/222
(58) Field of Search .......................... 117/13, 208, 217, 117/218, 222

(56) References Cited

U.S. PATENT DOCUMENTS

| | | | | |
|---|---|---|---|---|
| 5,720,810 A | * | 2/1998 | Arai et al. | ................... 117/221 |
| 5,730,799 A | * | 3/1998 | Ito | .............................. 117/201 |
| 5,800,612 A | * | 9/1998 | Shimomura et al. | ........ 117/201 |
| 6,090,198 A | * | 7/2000 | Aydelott | ...................... 117/13 |
| 6,527,859 B2 | * | 3/2003 | Lee et al. | ................... 117/217 |

FOREIGN PATENT DOCUMENTS

JP 11-189488 7/1999

* cited by examiner

Primary Examiner—Felisa Hiteshew
(74) Attorney, Agent, or Firm—Clark & Brody

(57) ABSTRACT

A method capable of securely pulling up a heavy single crystal is described. Using an apparatus comprising a crucible for storing a molten material for a single crystal; a heater for heating the molten material; means for pulling up the single crystal to grow by bringing a seed crystal in contact with the surface of the molten material in the crucible; and a flow-regulating member surrounding the single crystal at the growth area for shielding the heat of radiation and for regulating inert gas flow, the method comprises the following steps of setting the distance between the lower end of the flow-regulating member and the surface of the molten material to be a first distance D1 when the seed crystal comes into contact with the surface of the molten material in said crucible; forming the single crystal at the neck portion; thereafter setting the distance between the lower end of the flow-regulating member and the surface of the molten material to be a second distance D2 where D1 (mm)>D2 (mm); and forming the single crystal at the shoulder portion and subsequently forming the single crystal at the body portion. A dislocation-free single crystal having a heavy weight can be produced with a high crystal quality, and the method is applicable to various operation modes at which the apparatus is operated under various conditions of crystal growth.

10 Claims, 5 Drawing Sheets

METHOD FOR PULLING SINGLE CRYSTAL

FIELD OF THE INVENTION

The present invention relates to a method for pulling up a single crystal of semiconductor, such as silicon or the like, and more specifically to a method for pulling up a single crystal having a heavy weight, in which case, the single crystal can be grown in the dislocation-free state without any accidents of the single crystal dropping, thereby ensuring to stably produce the single crystal in a high crystalline quality.

DESCRIPTION OF THE PRIOR ART

In recent years, silicon single crystals, which are used to form a circuit device, such as a large-scale integrated circuit (LSI's), have been mostly produced by means of the Czochralski method (hereafter referred to as "the CZ method"). Such a single crystal grown by the CZ method is usually pulled up from a molten material in a quartz crucible, and oxygen is included in the crystal. This provides excellent properties regarding the substrate quality in the process of manufacturing LSI's.

In producing a single crystal using the CZ method, the pulling rate of the crystal has close relation to the temperature gradient in the single crystal. A greater temperature gradient provides acceleration in the pulling rate. Moreover, an inert gas is always supplied at the area around the crystal in the course of pulling up the crystal, and it is necessary to regulate the gas flow in order to avoid the turbulence, stagnation, convention and the like in a chamber for the crystal growth. In the case of industrially producing silicon single crystals, a flow-regulating member is normally disposed around the single crystal to be pulled, thereby allowing the heat of radiation to be a shield and the inert gas flow to be regulated.

FIG. 1 is a longitudinal sectional view of an apparatus for pulling up a silicon single crystal equipped with a flow-regulating member by the CZ method. A crucible 2, which is used to produce the silicon single crystal, is normally disposed in the center of the apparatus 1 for pulling the single crystal. The crucible 2 has a dual structure such that it comprises an inner quartz crucible 2a and an outer graphite crucible 2b. A heater 3 made of graphite is disposed outside the crucible 2 to fuse silicon into molten silicon 4 inside the crucible 2. A pulling wire 5 is used to pull up the single crystal, and a seed crystal 6 is attached onto one end of the pulling wire 5. The seed crystal 6, the lower end of which comes in contact with the surface of the molten silicon material 4, is pulled upwards and thus the single crystal 7 is grown by solidifying the molten material onto the lower end portion of the seed crystal.

In this case, a flow-regulating member 8 is disposed above the molten material 4 in such a way that it surrounds the silicon single crystal to be grown. The flow-regulating member 8 intercepts the heat of radiation emanating from both the heater 3 and molten material 4, thereby increasing the temperature gradient in the pulled single crystal 7. In the process of crystal growth, a high purity argon gas is always supplied into the chamber to form gas flow 31 (indicated by arrows in the drawing). The gas flow 31 thus formed is regulated by the flow-regulating member 8. The distance between the lower end of the flow-regulating member 8 and the surface of the molten material 4 stored in the crucible (hereafter the distance being simply referred to as the "gap") is normally determined to be 15–30 mm, taking into account the effects of both shielding the heat of radiation and regulating the inert gas flow.

In pulling up the single crystal by the CZ method, it is necessary to remove residual dislocations in the seed crystal as well as dislocations resulting from the thermal stress, when the seed crystal comes into contact with the molten material, and thus to prevent the effect of these dislocations from extending into the main body portion (body) of the single crystal. In order to produce a dislocation-free single crystal by eliminating dislocations from the crystal surface, the so-called "Dash neck process" is employed, in which case, the end of the crystal is tapered.

In the general Dash neck process, the crystal grown from the seed crystal is tapered into a very small diameter of 3 to 4 mm, so that the residual dislocations in the seed crystal and dislocations generated by the contact with the molten material can be moved outside the crystal, thereby enabling a dislocation-free single crystal to be grown. For this purpose, the neck portion is formed just after starting to pull up the crystal. When, however, the diameter at the neck portion exceeds 5 mm, the dislocations can hardly be moved to the outside the crystal, thereby making it difficult to produce the dislocation-free single crystal.

As described above, a diameter of not more than 4 mm at the neck portion enables the dislocations to be eliminated in a high efficiency. However, if the diameter at the neck portion is set to be too small, a high strength for supporting the single crystal ingot cannot be obtained. As a result, a fracture takes place at the neck portion in the process of pulling up the crystal or in the subsequent processes of cooling and removing the ingot, and further there is a possibility that the single crystal drops into the molten material in the crucible, thereby causing the apparatus for pulling up the single crystal to be damaged, the overflow of the molten material, steam explosion and other effects to take place, and causing a possible accident resulting in injury.

In the Dash neck process, a desired neck shape can be formed by controlling the pulling rate and the temperature of the molten material. An increase in the pulling rate or an increase in the temperature of the molten material provides a smaller diameter at the neck portion, whereas, a decrease in the pulling rate or a decrease in the temperature of the molten material provides a greater diameter at the neck portion.

However, even if the diameter at the neck portion is controlled into a fixed value, the crystal shape at the neck is altered when an unexpected disturbance occurs in the temperature of the molten material in the crucible. For instance, a sudden increase in the temperature of the molten material in the process of pulling up the single crystal provides a much smaller diameter at the neck portion, compared with the preset target value, or at worst it causes the single crystal to be separated from the surface of the molten material. In such a case, the neck portion is again immersed into the molten material and the Dash neck process has to be repeated.

The weight of the single crystal to be pulled up is conventionally limited to 100 Kg or so. In recent years, a high efficiency in the manufacture of semiconductor devices has been strongly required to increase both the diameter and the total length of single crystals, so that the weight of the single crystal tends to exceed 200 Kg. If the diameter of the single crystal at the neck portion is increased so as to avoid the above-mentioned problem, it is difficult to eliminate dislocations from the single crystal in the Dash neck method, as described above, so that the work to re-form the neck portion is frequently repeated. Along with an increase in the weight of the single crystal, when it is preferentially intended to prevent the neck portion from being damaged or to prevent the single crystal from dropping, it is difficult to eliminate dislocations therefrom, thereby increasing the number of the re-works in the Dash neck process and thus reducing the efficiency conspicuously in the process of the single crystal.

To overcome the above problem resulting from the increase in the weight of the single crystal, the present applicant proposed a method for producing a single crystal with an increased gap in Japanese Patent Application Laid-open No. 11-189488 (hereafter this method is simply abbreviated as the "gap-increased method"). The apparatus for pulling up a single crystal was designed such that the distance between the lower end of a flow-regulating member surrounding the single crystal to be pulled up and the surface of a molten material in a crucible was greater than that in the conventional method using the CZ method, and the single crystal was pulled up in the state in which a seed crystal is in contact with the molten material, after the single crystal is heated to provide a small difference in temperature between the lower end of the seed crystal and the molten material.

In the "gap-increased method" thus proposed, the heat of radiation from the heater to the seed crystal increases, and therefore the temperature difference between the lower end of the seed crystal and the surface of the molten material can be decreased. As a result, the thermal stress at the moment of contact is reduced, thereby enabling the number of dislocations to be reduced at this moment.

Moreover, an increase in the gap provides an increase in the amount of radiation emanating from the heater to the neck portion during pulling. This provides various effects: the temperature gradient at the neck portion decreases; the isothermal lines become flatter; the temperature gradient at the neck portion in the radial direction decreases; the thermal stress decreases and at the same time the traveling speed of the dislocations decreases, hence enabling the dislocations at the neck portion to be removed at a high efficiency. Accordingly, these effects allow the dislocations to be removed even in the case of an increased diameter at the neck portion, thereby making it possible to pull up the single crystal having an increased weight without any propagation of dislocations.

In accordance with the gap-increased method proposed therein, furthermore, the conditions of thermal shield for the heat of radiation emanating from the molten material and heater in the course of growing the single crystal as well as the thermal history can be varied.

It is recognized that the thermal history during the crystal growth provides a strong effect on the formation of micro-defects in the single crystal and the properties of the micro-defects to be formed can be varied by the thermal history. For instance, when the single crystal is pulled up with an increased gap, the micro-defects can hardly be formed, although the pulling rate cannot be increased, whereas when the single crystal is pulled up with a decreased gap, the pulling rate can be accelerated and it is possible to form single crystals including micro-defects of different type. Regarding the quality of finished crystals, furthermore, there are various requirements of users on micro-defects in the crystal and therefore a variety of conditions for growing a single crystal is employed to meet these requirements.

SUMMARY OF THE INVENTION

Taking the above matters into account, the present invention is achieved. The objects of the present invention are to provide a method for pulling up a single crystal, which allows to grow a dislocation-free single crystal under the prerequisite conditions of pulling up the single crystal having a heavy weight, even in the case of a flow-regulating member being disposed with a greater gap than those in the normal one, to provide a method for pulling up a single crystal, which enables a single crystal to be securely pulled up without any accident of dropping, and to provide a method for pulling up a single crystal, which provides a high degree of freedom in selecting the conditions of crystal growth.

To attain the above objects, the present inventors investigated to determine a suitable diameter of the single crystal at the neck portion and to determine the conditions for crystal growth. Regarding the selection of the diameter at the neck portion, the present inventors have found that the accident of a single crystal dropping can be avoided, and a dislocation-free single crystal can be obtained, when the diameter at the neck portion is set to be not less than 6 mm.

Actually, when a single crystal having a diameter of 3 to 4 mm as a target diameter is produced with the conventional Dash neck process, a sudden change in the temperature of the molten material makes it difficult to control the diameter at the neck portion, and a single crystal having a smaller diameter compared with a preset target value is usually formed. In fact, it is often encountered to obtain a single crystal having a diameter of less than 3 mm. In this case, assumed that a maximum possible tensile strength at the neck portion is 20 Kg/mm$^2$, the weight at which the single crystal can be pulled up is less than 141 Kg or so, hence making it impossible to support a single crystal having a weight of more than 200 Kg. In this case, therefore, it is necessary to again re-form the neck portion after melting the crystal.

On the contrary, when the diameter at the neck portion is set to be not less than 6 mm as a target value, the minimum diameter of 5 mm can be obtained even if the crystal having a smaller diameter than the target value by 1 mm is formed in the same circumstance of processing. In this case, the weight at which the single crystal can be pulled up is not less than 392 Kg and there is no problem in supporting a single crystal having a weight of more than 200 Kg, hence enabling the process of pulling up to securely continue without any trouble of dropping.

However, if the shoulder portion and body portion are produced using the same increased gap after the formation of the neck portion in the gap-increased method, this leads to a varied thermal history for the single crystal, because the condition of radiation is altered, compared with the conventional CZ method.

A study of the influence of the thermal history on the crystal quality reveals that the crystal can be grown in a stage in which varied conditions of crystal growth can be selectively satisfied by changing the gap in the stage of growth at the shoulder and body portions. In the stage of the growth at the neck portion, an increased gap (first distance D1) is selected to form dislocation-free single crystal without the accident of dropping, whereas in the stage of the growth at the shoulder and body portions, a small gap (second distance D2) is selected to form a single crystal under corresponding condition of growth. With this method, it is possible to securely pull up a dislocation-free single crystal having a heavy weight under varied conditions by correspondingly changing the gap in the stage of growth at the neck portion as well as at the shoulder and body portions.

The gists in the present invention, based on the above findings, are two methods (1) and (2) for pulling up a silicon single crystal as follows:

(1) A method for pulling a silicon single crystal, using an apparatus comprising a crucible for storing a molten material for a single crystal to be grown; a heater for heating the molten material; means for pulling up the single crystal to grow after bringing a seed crystal in contact with the surface of the molten material in the crucible; and a flow-regulating member surrounding the single crystal at the growth area for shielding the heat of radiation and for regulating inert gas flow, comprising the following steps of: setting the distance between the lower end of the flow-regulating member and the surface of the molten material to be a first distance D1 when the seed crystal comes into contact with the surface of the molten material in the crucible; forming the single crystal at the neck portion after the seed crystal is in contact with the molten material; thereafter setting the distance between the lower end of the flow-regulating member and the surface of the molten material to be a second distance D2 where D1 (mm)>D2 (mm); and forming the single crystal at the shoulder portion and subsequently forming the crystal at the body portion.

(2) In the above method (1), it is preferable that the speed of moving the flow-regulating member is 0.1 mm/min to 1.2 mm/min, when the distance between the lower end of the flow-regulating member and the surface of the molten material is changed from the first distance D1 to the second distance D2.

DESCRIPTION OF PREFERRED EMBODIMENTS

The method for pulling up a crystal according to the present invention is characterized by steps of: disposing a flow-regulating member at a first distance D1 in the gap-increased method; bringing a seed crystal into contact with the molten material, and then performing the crystal growth at the neck portion to form a dislocation-free single crystal; subsequently disposing the flow-regulating member at a second distance D2; and performing the crystal growth at the shoulder and body portions.

Figure 2:
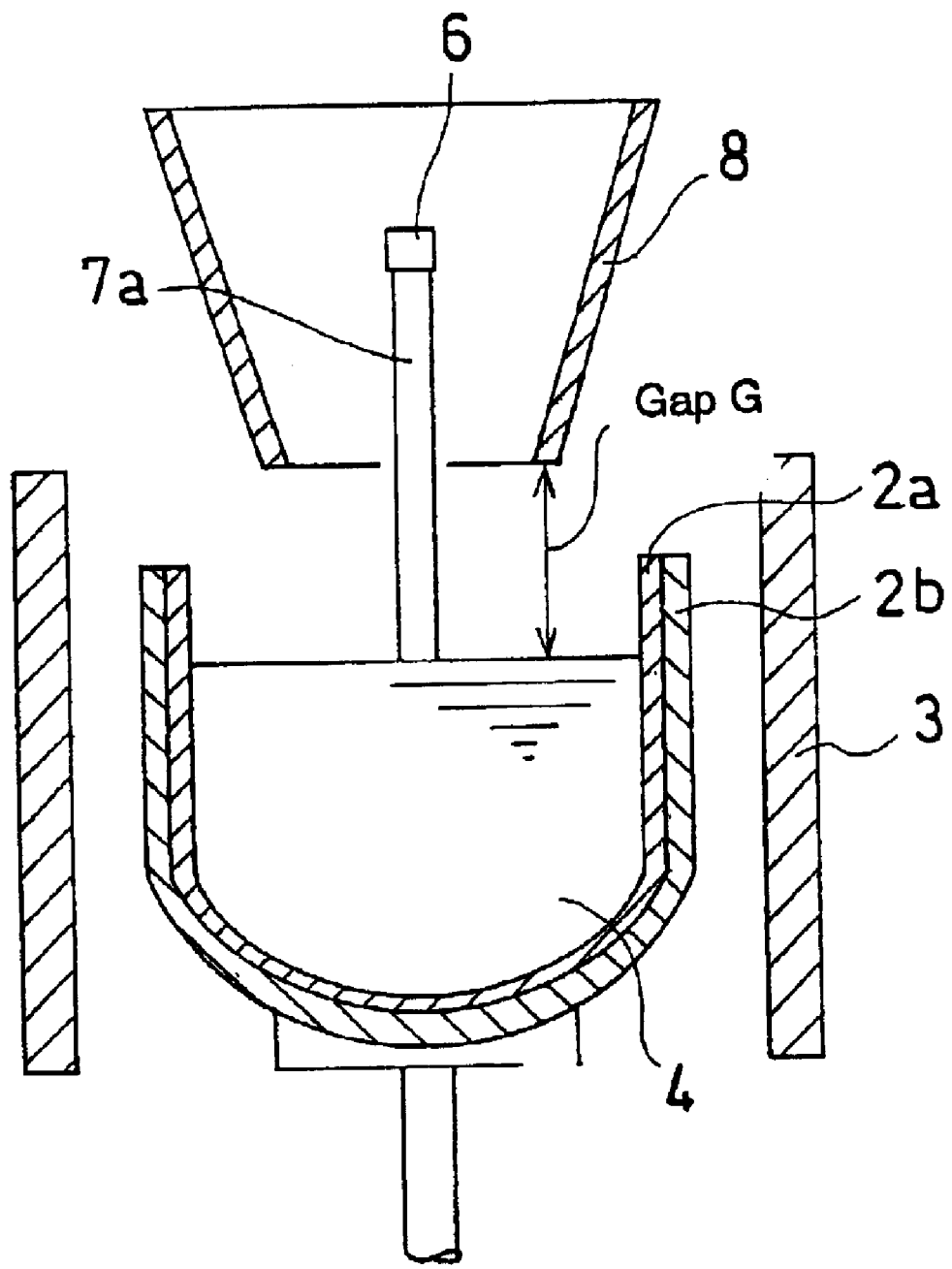
FIG. 2 is a longitudinal sectional view of a part of the apparatus according to the present invention where the single crystal is pulled.

FIG. 2 is a longitudinal sectional view of a part of the apparatus according to the present invention where the single crystal is pulled up. The flow-regulating member 8, which is used to intercept the heat of radiation and to regulate the inert gas flow, is disposed such that it surrounds the area where a silicon single crystal is pulled up, that is, the seed crystal 6 and neck portion 7a in FIG. 2. In such an arrangement, the center of the flow-regulating member 8 coincides with the axis of pulling up the single crystal and the distance between the lower end of the member and the surface of the molten material 4 stored in the crucible is denoted by gap G.

In the present invention, the gap G is selectively used. The first distance D1 is used in the gap-increased method to form the single crystal at the neck portion after the seed crystal comes into contact with the molten material. Preferably, the distance D1 is 30 to 200 mm. From the viewpoint of the stability in the temperature distribution at the area of pulling up the crystal, it is more preferable that it is set to be 30 to 130 mm. The second distance D2 used to form the crystal at the shoulder and neck portions is set to be the same gap as used in the conventional CZ method, and it is preferably 15 to 40 mm.

By altering the gap from the first distance D1 to the second distance D2 in accordance with the development of crystal growth from the neck portion to the shoulder and body portions, it is possible to reduce the temperature difference between the seed crystal and the surface of the molten material at the formation of the crystal at the neck portion, thereby enabling the dislocations introduced at the moment of contact to be reduced and at the same time to enhance the ability of removing the dislocations. Moreover, in the crystal growth at the shoulder and body portions, the thermal history is the same as that in the conventional CZ method, so that the single crystal having the same quality can also be obtained.

Means for altering the gap G in the apparatus according to the invention, is not explicitly shown in the drawing, but it is conceivable that either means for varying the vertical position of the crucible to vary the surface level of the molten material or means for lifting the flow-regulating member to vary the vertical position of its lower end can be employed.

FIGS. 3A–3E are enlarged sectional views of the apparatus in the vicinity of the seed crystal for schematically illustrating the mechanism of crystal growth from the neck portion to the body portion via the shoulder portion in the method for pulling up the single crystal according to the present invention. In the following, referring to the respective drawings of FIGS. 3A to 3E, the process of crystal growth after the seed crystal becomes in contact with the molten material will be described in detail.

Figure 3A:
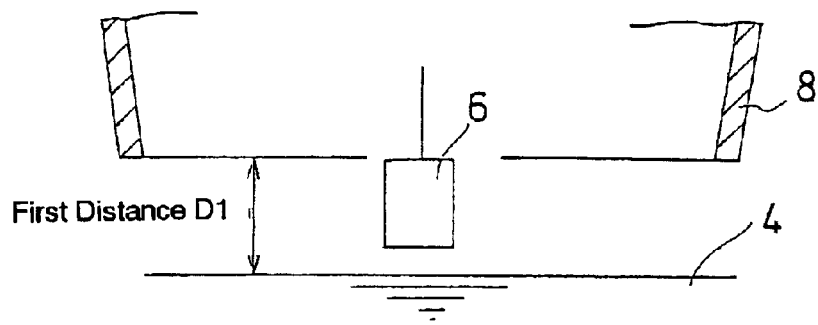
FIGS. 3A–3E are enlarged sectional views of the apparatus in the vicinity of the seed crystal for schematically illustrating the mechanism of crystal growth from the neck portion to the body portion via the shoulder portion in the method for pulling up the single crystal according to the present invention.

In FIG. 3A, the distance between the lower end of the flow-regulating member 8 and the surface of the molten material 4 is set at the first distance D1. The seed crystal 6, which is mounted at the lower end of a mechanism for pulling up the crystal, is rotated at a predetermined rate in the direction opposite to the rotary direction of the crucible and is lowered just above the surface of the molten material 4 stored in the crucible. In this stage, it is preferable that the lower end of the seed crystal 6 is finally heated at a temperature of not less than 1380° C. (the melting point of the seed crystal being 1410° C.).

A decreased diameter of the seed crystal 6 provides a reduction in the thermal stress resulting from the contact with the surface of the molten material, thereby enabling the introduced dislocations to be reduced. In order to form the crystal having a predetermined diameter at the neck portion, it is necessary to employ a seed crystal having a corresponding preset size. However, an increased diameter of the seed crystal makes it difficult to sufficiently heat the lower end of the seed crystal 6. It is preferable that the diameter of the seed crystal 6 should be selected to be 6 to 15 mm, since the diameter at the neck portion is set to be not less than 6 mm, and the upper limit of the diameter free from dislocations is 15 mm or so, as will be described below.

Figure 3B:
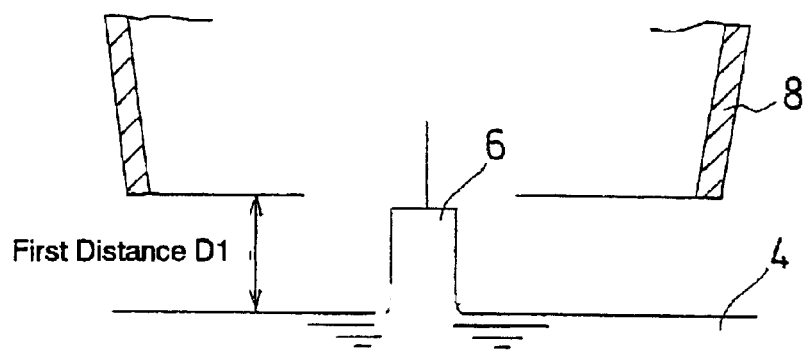

In FIG. 3B, the seed crystal 6 is lowered and its lower end comes into contact with the surface of the molten material 4. In the moment of contact, the temperature difference between the lower end of the seed crystal 6 and the molten material 4 is small. Accordingly, the thermal stress resulting from the temperature difference is decreased and therefore the number of the introduced dislocations can be reduced.

Figure 3C:
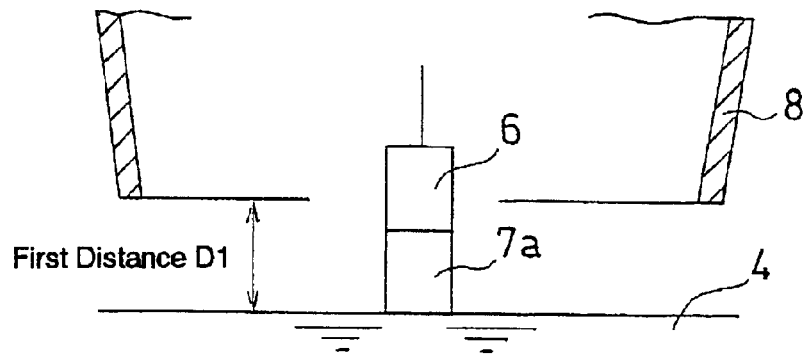

In FIG. 3C, the molten material 4 is solidified at the lower end of the seed crystal 6 and the crystal at the neck portion 7a is grown. In this case, the neck portion 7a is formed by pulling up the seed crystal at a greater speed than that at which the crystal at the body portion is grown. In the formation of the neck portion 7a, the flow-regulating member 8 is positioned at the first distance D1, so that a greater amount of radiation is transferred from both the heater and the molten material to the neck portion 7a. Accordingly, this causes the temperature gradient at the neck portion 7a to reduce, so that the thermal stress is reduced and, at the same time, the traveling speed of dislocations is reduced, thereby making it possible to enhance the ability of removing the dislocations from the neck portion 7a.

In accordance with the present invention, the crystal having a diameter of not less than 6 mm is grown at the neck portion. This is due to the fact that, in the case of the diameter of less than 6 mm at the neck portion, the occurrence of a sudden variation in the temperature of the molten material makes it impossible to control the crystal growth at the neck portion, and a single crystal having a weight of more than 200 Kg cannot be supported, as described above. On the other hand, it is not necessary to specifically determine the upper limit of the diameter at the neck portion, so long as the dislocation-free single crystal can be grown in the diameter. However, it is shown from the investigation made by the present inventors that the upper limit attainable in the gap-increased method is 15 mm, and therefore this value can be preferably used as the upper limit.

Figure 3D:
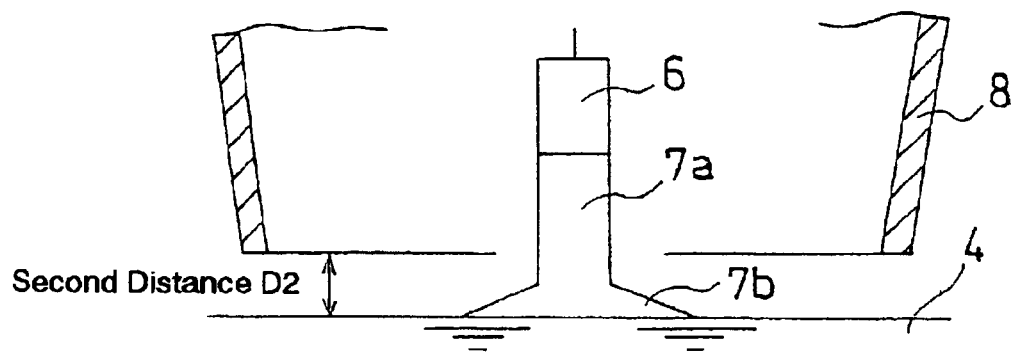

In FIG. 3D, the seed crystal 6 is pulled up at a reduced speed under the condition that the distance between the lower end of the flow-regulating member 8 and the surface of the molten material 4 is set at the second distance D2, and the single crystal at the shoulder portion 7b is grown so as to increase the diameter thereof from that at the neck portion 7a to that at the body portion. In this case, a rapid change of the gap provides an excess change in the temperature distribution of the molten material, thereby making it difficult to control the diameter of the single crystal to be grown, hence providing an abrupt deformation of the crystal and inducing to introduce dislocations into the crystal. For this purpose, a certain limitation is required regarding the speed of varying the gap.

In accordance with the investigation, which was made by the present inventors, taking into account the heat insulating material, the properties and shape of the heater, the size of the crucible and the effect of the amount of charge, it was found that the speed of varying the gap must be not more than 1.2 mm/min in order to avoid both the sudden deformation of the crystal and the introduction of dislocations. When, moreover, the speed of varying the gap is too slow, a very long time is required to shift the gap from the first distance D1 to the second distance D2. To avoid this, the lower limit of the speed should be set to be preferably 0.1 mm/min. In addition, a greater amount of the gap change is undesirable for the temperature distribution in the chamber, in particular at the area of crystal growth, along with an increased time necessary for changing the gap. Accordingly, it is desirable that the gap distance between the first distance D1 and the second distance D2 should be not more than 160 mm.

Figure 3E:
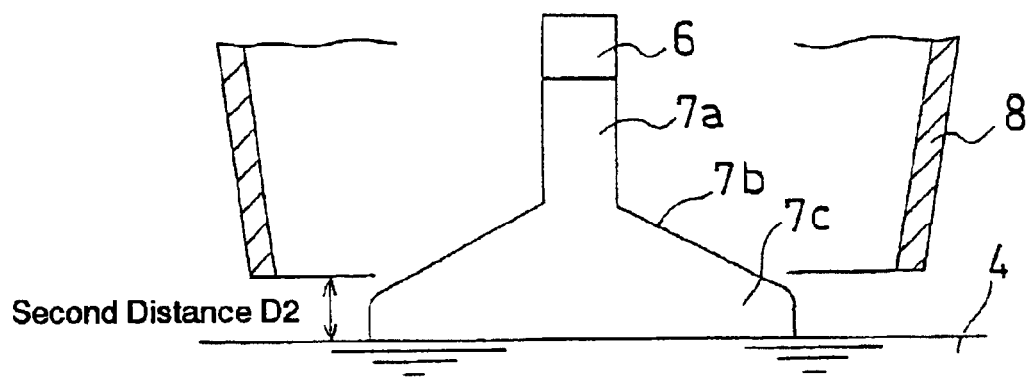

In FIG. 3E, the crystal at body portion 7c is pulled up in the state in which the flow-regulating member 8 is set at the second distance D2. In this case, the conditions of pulling up the crystal and of receiving the heat from the heater, including that of radiation are the same as those in the conventional CZ method. Therefore, the single crystal can be pulled up without any influence on the crystal quality as same as that in the conventional CZ method.

As described above, in the method of the present invention, the dislocation-free single crystal can be grown at the neck portion, and then the gap can be altered into the distance used in the conventional CZ method, so that the effect in the gap-increased method can be obtained, thereby ensuring the same crystal quality as in the conventional CZ method.

In accordance with the method of the present invention, the apparatus can be operated by selectively adapting the operation mode to various conditions of crystal growth. Moreover, since the gap can be automatically changed, the crystal growth can be carried out under optimal conditions, respectively at the neck, shoulder and body portions in accordance with the increased weight without any confusion in operation for an operator.

In the above description, the present invention has been elucidated exclusively regarding the conventional CZ method. However, the invention is not restricted thereto. It can also be applied to another pulling method, for instance to the so-called MCZ method (magnetic Czochralski method) in which a magnetic field is applied to the molten material.

EXAMPLES

The function and advantage of the present invention will be described, based on the present examples 1 and 2 and the comparative examples 1 and 2.

Present Example 1

Figure 1:
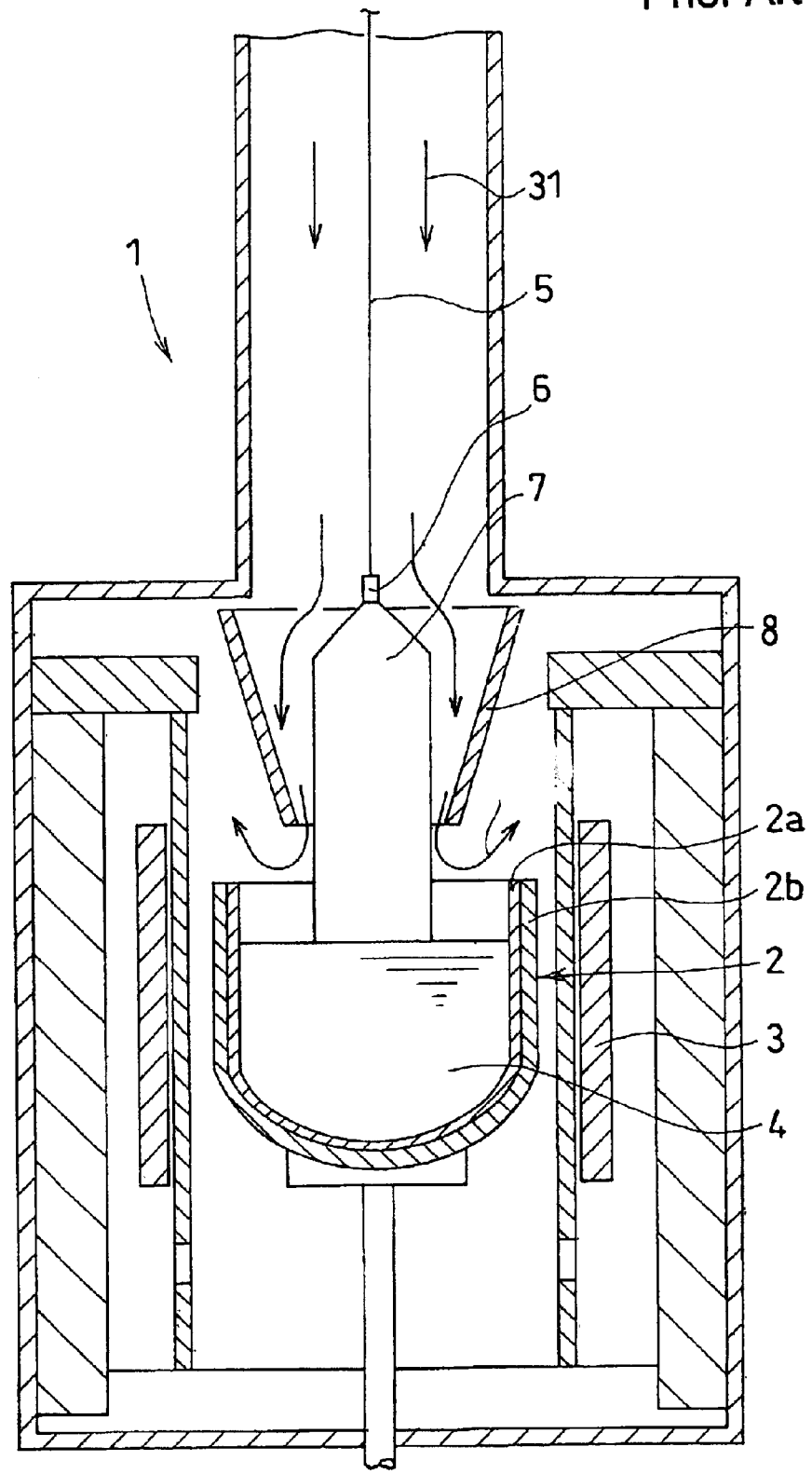
FIG. 1 is a longitudinal sectional view of an apparatus for pulling up a silicon single crystal by the CZ method, the apparatus being equipped with a gas flow-regulating member.

Using the single crystal producing apparatus shown in FIG. 1, a single crystal having a heavy weight of 200 Kg and a 300 mm diameter and a 1000 mm body length in the finished shape was pulled. The crystal was grown as follows: the material having a charge amount of 220 Kg was pulled up at a rate of 2.5 mm/min to form a single crystal having a target diameter of 6 mm at the neck portion under the conditions that the revolution speed of the crystal was 6 r.p.m.; the revolution speed of the crucible was 12 r.p.m.; and the gap was set to be a first distance D1 of 100 mm. Thereafter, the gap was altered to a second distance D2 of 30 mm at a gap-changing speed of 0.7 mm/min and the crystal was pulled to form a single crystal at the shoulder portion and subsequently pulled up at a rate of 0.7 mm/min to form a single crystal having the target diameter of 300 mm at the body portion. Thus, 10 single crystals were produced under the same conditions.

Figure 4:
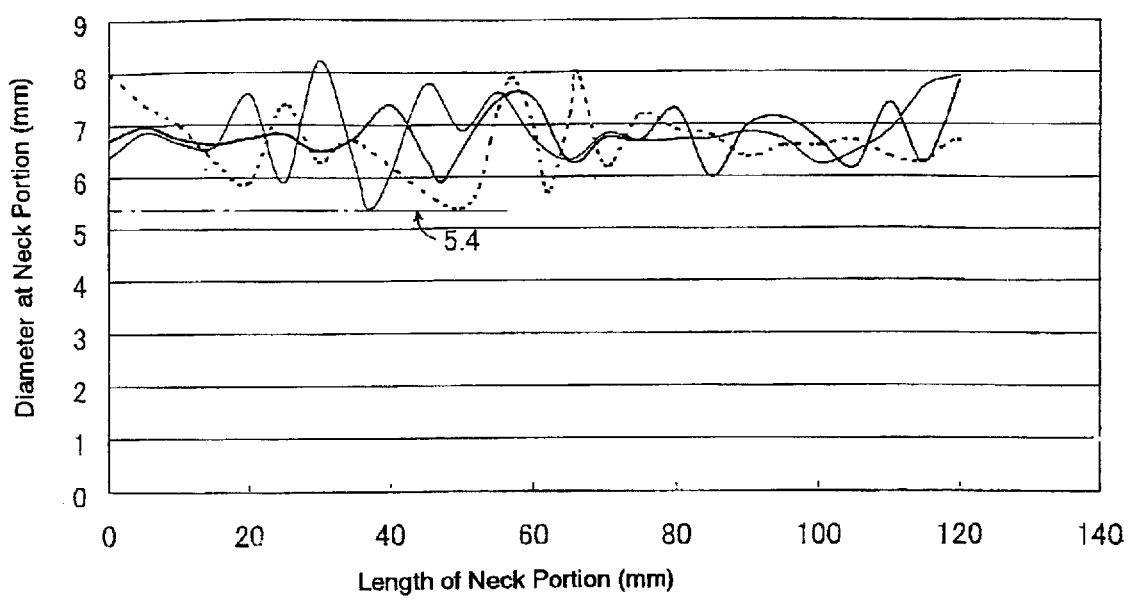
FIG. 4 is a diagram showing the relationship between the measured diameter at the neck portion and the length of the neck portion for the single crystal formed in example 1.

FIG. 4 is a diagram showing the relationship between the measured diameter at the neck portion and the length of the neck portion for the single crystal formed in the present example 1. In the diagram, the results measured as for only three crystals, i.e., the first to third crystal, are shown. It can be recognized that all the crystals having a diameter of not less than the minimum value 5.4 mm were formed over the entire measured length of 120 mm, and such a single crystal having a heavy weight of more than 200 Kg can readily be supported in the process of pulling up. The other results are listed in Table 1.

Present Example 2

A single crystal at the neck portion was grown under the same conditions as in the present example 1, except for a first distance D1 of 120 mm being used. After that, the gap was changed into a second distance D2 of 30 mm at a changing speed of 0.7 mm/min, and the crystal was further grown at the shoulder portion and subsequently at the body portion. Thus, 10 single crystals were produced under the conditions.

Comparative Example 1

Using the gap-increased method proposed previously, a heavy single crystal having a 300 mm diameter and a 1000 mm body length in the finished shape was pulled up. The material having a charge amount of 220 Kg was pulled up at a speed of 2.5 mm/min to form a single crystal having a target diameter of 6 mm at the neck portion under the conditions that the revolution speed of the crystal was 6 r.p.m; the revolution speed of the crucible was 12 r.p.m.; and the gap was set to be a first distance D1 of 100 mm. Thereafter, the crystal was pulled up to form a single crystal at the shoulder portion and subsequently pulled up at a rate of 0.3 mm/min to form a single crystal having the target diameter of 300 mm at the body portion. Thus, 10 single crystals were produced under the same conditions.

Comparative Example 2

Employing the conventional CZ method, a heavy single crystal having a 300 mm diameter and a 1000 mm body length in the finished shape was pulled up. The material having a charge amount of 220 Kg was pulled up at a rate of 2.5 mm/min to form a single crystal having a target diameter of 6 mm at the neck portion under the conditions that the revolution speed of the crystal was 6 r.p.m; the revolution speed of the crucible was 12 r.p.m.; and the gap was set to be 20 mm. Thereafter, the crystal was pulled up to form a single crystal at the shoulder portion and subsequently pulled up at a rate of 0.7 mm/min to form a single crystal having the target diameter of 300 mm at the body portion.

(Comparison of the Results)

The results obtained in the present examples 1 and 2 and comparative examples 1 and 2 are shown in Table 1. In the present examples 1 and 2, the DF rate was 100% and desired crystal quality was obtained. On the contrary, in comparative examples 1 and 2, no desired crystal quality was obtained, and the rate was 67% in the comparative example 2.

TABLE 1

| No. | Classification | DF rate (%) | Crystalline Property | Total Evaluation |
| --- | --- | --- | --- | --- |
| 1 | Present Example 1 | 100% | the desired pulling rate being satisfied and desired quality being obtained | ◯ (Good) |
| 2 | Present Example 2 | 100% | the desired pulling rate being satisfied and desired quality being obtained | ◯ (Good) |
| 3 | Comparative Example 1 | 100% | being unsatisfied and desired quality being un-obtained | X (Bad) |
| 4 | Comparative Example 2 | 67% | the desired pulling rate being satisfied and desired quality being obtained | Δ (Fair) |

As described above, the method for pulling up a single crystal according to present invention allows a dislocation-free single crystal having a heavy weight to be securely pulled up without any accident of dropping by altering the in the course of the pulling process, and further the method is applicable to various operation modes at which the apparatus is operated under various conditions of crystal growth.

What is claimed is:

1. A method for pulling up a single crystal, using an apparatus comprising a crucible for storing a molten material for a single crystal; a heater for heating the molten material; means for pulling up the single crystal to grow after bringing a seed crystal in contact with a surface of the molten material in the crucible; and a flow-regulating member surrounding the single crystal at the growth area for shielding the heat of radiation and for regulating an inert gas flow, wherein the method comprises the following steps of: setting the distance between the lower end of said flow-regulating member and the surface of the molten material to be a first distance D1 when the seed crystal comes into contact with the surface of the molten material in said crucible; forming the single crystal at the neck portion; thereafter setting the distance between the lower end of said flow-regulating member and the surface of said molten material to be a second distance D2 where D1(mm)>D2 (mm); and forming the single crystal at the shoulder portion and subsequently forming the single crystal at the body portion.

2. A method for pulling up a single crystal according to claim 1, wherein the speed at which the distance between the lower end of the flow-regulating member and the surface of the molten material is altered from the first distance D1 to the second distance D2 after the formation of the neck portion is 0.1 mm/mm to 1.2 mm/mm.

3. A method for pulling up a single crystal according to claim 1, wherein the first distance D1 in the formation of the single crystal at the neck portion is set to be 30 to 200 mm.

4. A method for pulling up a single crystal according to claim 2, wherein the first distance D1 in the formation of the single crystal at the neck portion is set to be 30 to 200 mm.

5. A method for pulling up a single crystal according to claim 1, wherein the second distance D2 is altered within a range of 15 to 40 mm, when the single crystal is formed at the shoulder portion.

6. A method for pulling up a single crystal according to claim 2, wherein the second distance D2 is altered within a range of 15 to 40 mm, when the single crystal is formed at the shoulder portion.

7. A method for pulling up a single crystal according to claim 1, wherein the length of the crystal which is grown when the gap is altered from the first distance D1 to the second distance D2 after the formation of the neck portion is not more than 160 mm.

8. A method for pulling up a single crystal according to claim 2, wherein the length of the crystal which is grown when the gap is altered from the first distance D1 to the second distance D2 after the formation of the neck portion is not more than 160 mm.

9. A method for pulling up a single crystal according to claim 1, wherein the diameter of the single crystal at the neck portion is not less than 6 mm.

10. A method for pulling up a single crystal according to claim 2, wherein the diameter of the single crystal at the neck portion is not less than 6 mm.

* * * * *